United States Patent
Kim et al.

(10) Patent No.: US 9,088,130 B2
(45) Date of Patent: Jul. 21, 2015

(54) APPARATUS AND METHOD FOR STABILIZING WAVELENGTH TUNABLE LASER

(71) Applicants: SAMSUNG ELECTRONICS CO., LTD., Suwon-si (KR); Korea Advanced Institute of Science and Technology, Daejeon (KR)

(72) Inventors: Hong Sig Kim, Seongnam-si (KR); Wang Yuhl Oh, Daejeon (KR); Tae Hwan Kim, Daejeon (KR); Jae Guyn Lim, Hwaseong-si (KR); Han Saem Cho, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 130 days.

(21) Appl. No.: 13/845,602

(22) Filed: Mar. 18, 2013

(65) Prior Publication Data

US 2013/0259073 A1    Oct. 3, 2013

(30) Foreign Application Priority Data

Mar. 29, 2012 (KR) .................. 10-2012-0032589

(51) Int. Cl.
*H01S 5/068* (2006.01)
*H01S 5/0687* (2006.01)
*H01S 5/14* (2006.01)
*H01S 3/13* (2006.01)
*H01S 3/137* (2006.01)
*H01S 5/062* (2006.01)

(52) U.S. Cl.
CPC ........... *H01S 5/06821* (2013.01); *H01S 5/0687* (2013.01); *H01S 5/141* (2013.01); *H01S 5/146* (2013.01); *H01S 3/1303* (2013.01); *H01S 3/137* (2013.01); *H01S 5/06216* (2013.01)

(58) Field of Classification Search
CPC ..... H01S 5/068; H01S 5/0683; H01S 5/0687; H01S 3/136; H01S 3/137; H01S 3/1392
See application file for complete search history.

(56) References Cited

U.S. PATENT DOCUMENTS

| | | | | |
|---|---|---|---|---|
| 6,493,125 B1 * | 12/2002 | Tanaka et al. | ................... | 398/95 |
| 6,567,436 B1 * | 5/2003 | Yao et al. | ......................... | 372/32 |
| 7,492,795 B1 * | 2/2009 | Delfyett et al. | .......... | 372/29.011 |
| 2002/0176452 A1 * | 11/2002 | Lin et al. | ......................... | 372/18 |
| 2007/0153289 A1 * | 7/2007 | Yilmaz et al. | ................. | 356/464 |

* cited by examiner

*Primary Examiner* — Julio J Maldonado
*Assistant Examiner* — Joshua King
(74) *Attorney, Agent, or Firm* — NSIP Law

(57) ABSTRACT

An apparatus and method for stabilizing an output of a laser is provided. An optical amplifier oscillates light having a first wavelength band. A filter filters the light having the first wavelength band to output light having a second wavelength band narrower than the first wavelength band. The light having the second wavelength band may correspond to an output of a laser. To stabilize the wavelength center of the output laser, at least a portion of the light having the second wavelength band may be transferred to a fiber Bragg Grating (FBG) through a coupler. By performing feedback of a difference between the signal output from the FBG and a laser modulation signal, an offset corresponding to a lead zirconate titanate (PZT) operating parameter of a Fabry-Perot filter may be controlled to automatically stabilize the wavelength center.

6 Claims, 4 Drawing Sheets

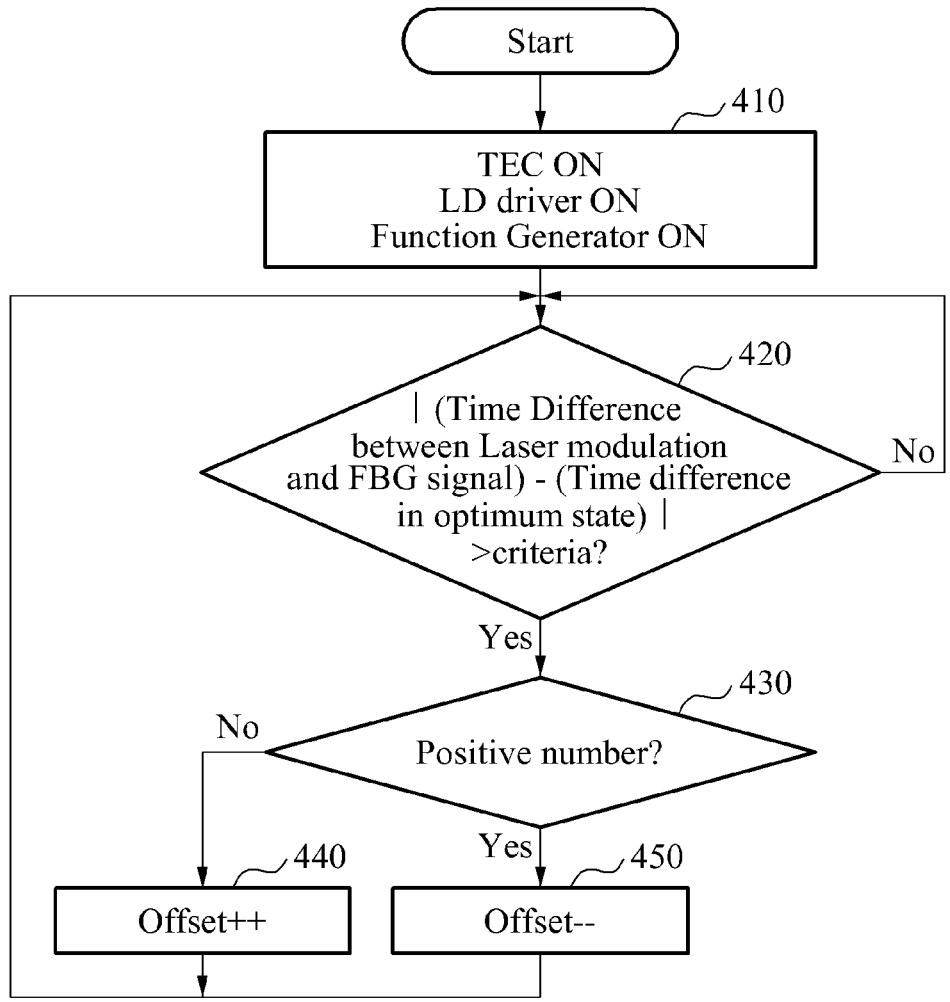

APPARATUS AND METHOD FOR STABILIZING WAVELENGTH TUNABLE LASER

CROSS-REFERENCE TO RELATED APPLICATION(S)

This application claims the benefit under 35 U.S.C. §119 (a) of Korean Patent Application No. 10-2012-0032589, filed on Mar. 29, 2012, in the Korean Intellectual Property Office, the entire disclosure of which is incorporated herein by reference for all purposes.

BACKGROUND

1. Field

The following description relates to an apparatus and method for stabilizing operation of a wavelength tunable laser, and more particularly, to an apparatus and operating method thereof that may perform stabilization using feedback from a tunable Fabry-Perot filter of the center of a wavelength of a high speed wavelength tunable laser.

2. Description of Related Art

A high speed wavelength tunable laser including a tunable Fabry-Perot filter can be used as a light source for medical imaging. In one example, a high speed wavelength tunable laser including a tunable Fabry-Perot filter may be used as a light source for a second generation optical coherence tomography (OCT) system.

Since the tunable Fabry-Perot filter may be affected by factors of a peripheral environment, for example, temperature, the center of a tuned wavelength may change over time and stabilization of the laser may be difficult as a result.

An operating value of a tunable Fabry-Perot filter may be manually controlled by a user during the process of adjusting the wavelength center. As a result, the process of adjusting a wavelength center of conventional high speed wavelength tunable laser using a tunable Fabry-Perot filter requires a relatively long adjustment time.

The manual adjusting of a parameter by the user may result in a time delay while using a device. In addition, manual adjustment may cause difficulty in manipulation of the device resulting in inconvenience to a user unskilled in such manipulation, for example, a medical technician using a medical device and/or an imaging system. Accordingly, there is a desire for a method of stabilizing a wavelength of a laser without the difficulty presented by manual control.

SUMMARY

Provided is a stabilization apparatus and method that may adjust a wavelength center of a tunable wavelength band by automatically using feedback of a wavelength center of a laser and thereby reduce inconvenience associated with manual control of a wavelength tunable laser device.

In one general aspect, an apparatus configured to stabilize an output of a laser comprises an optical amplifier configured to oscillate light having a first wavelength band based on a laser modulation signal; a filter configured to filter the light having the first wavelength band and output light having a second wavelength band narrower than the first wavelength band; a reference signal generator configured to generate a reference signal by amplifying at least a portion of the light having the second wavelength band; and a controller configured to minimize a time difference between the laser modulation signal and the reference signal using feedback of the time difference between the laser modulation signal and the reference signal.

The filter may include a Fabry-Perot mirror having a transparent condition configured to provide light having a narrow band wavelength corresponding to the second wavelength band. In addition, the filter may be a tunable Fabry-Perot filter. The tunable Fabry-Perot filter may be configured to change the transparent condition by oscillating the Fabry-Perot mirror using lead zirconate titanate (PZT).

The controller may be configured to: compare a predetermined criterion to a differential of: a time difference between the laser modulation signal and the reference signal, and a difference in an oscillation time in a predetermined range of a normal operation of the laser; and change an offset of the PZT when the comparison indicates the differential is less than or equal to the predetermined criterion.

The reference signal generator may be a fiber Bragg grating (FBG) configured to amplify at least a portion of the light having the second wavelength band corresponding to a characteristic value of the FBG to generate the reference signal.

In yet another general aspect, an apparatus configured to stabilize an output of a laser comprises: a Fabry-Perot filter configured to filter light amplified by a semiconductor optical amplifier having the first wavelength band and provide light having a second wavelength band narrower than a first wavelength band; a fiber Bragg grating (FBG) configured to amplify a portion of the light having the second wavelength band provided from the Fabry-Perot filter to generate a reference signal; and a controller configured to maintain a differential of 1) a time difference between a laser modulation signal corresponding to a criterion for selecting the second wavelength band and the reference signal provided by the FBG, and 2) a difference in an oscillation time in a predetermined range of a normal operation of the laser to be less than a predetermined criterion by adjusting an offset of the Fabry-Perot filter.

The Fabry-Perot filter may include a Fabry-Perot mirror and is configured to control a filtering characteristic for providing the second wavelength band by oscillating the Fabry-Perot mirror using lead zirconate titanate (PZT).

The offset may correspond to an operating parameter at which the PZT oscillates the Fabry-Perot mirror.

In yet another general aspect, a method of stabilizing an output of a laser comprises: oscillating, by an optical amplifier, light having a first wavelength band, based on a laser modulation signal; filtering, by a filter, the light having the first wavelength band to provide light having a second wavelength band narrower than the first wavelength band; amplifying, by a reference signal generator, at least a portion of the light having the second wavelength band to generate a reference signal; and controlling, by a controller, the filter to stabilize a wavelength center of the output of the laser by performing feedback of a time difference between the laser modulation signal and the reference signal.

The filter may be a tunable Fabry-Perot filter including a Fabry-Perot minor and controlling the filter to stabilize a wavelength center of the output of the laser may further include controlling an input offset of lead zirconate titanate (PZT) that oscillates the Fabry-Perot minor included in an internal portion of the filter.

In addition, controlling the filter to stabilize a wavelength center of the output of the laser further may include: comparing a predetermined criterion to a differential of: a time difference between the laser modulation signal and the reference signal, and a difference in an oscillation time in a predetermined range of a normal operation of the laser; and changing the offset of the PZT when the comparison indicates the differential is less than or equal to the predetermined criterion.

The reference signal generators may be a fiber Bragg grating (FBG) and providing the reference signal may comprise amplifying at least a portion of the light having the second wavelength band corresponding to a characteristic value of the FBG.

In yet another general aspect, a method of stabilizing an output of a laser comprises: filtering, by a Fabry-Perot filter, light amplified by a semiconductor optical amplifier having the first wavelength band to provide light having a second wavelength band narrower than a first wavelength band; amplifying, by a fiber Bragg grating (FBG), a portion of the light having the second wavelength band provided from the Fabry-Perot filter to generate a reference signal; and controlling, by a controller, the laser modulation signal by performing feedback of a time difference between the reference signal and the laser modulation signal.

In addition, filtering light amplified by a semiconductor optical amplifier having the first wavelength band to provide light having a second wavelength band may comprise controlling a parameter, based on the laser modulation signal, at which the Fabry-Perot filter oscillates a Fabry-Perot mirror included in the Fabry-Perot filter using lead zirconate titanate (PZT).

In yet another general aspect, a non-transitory computer-readable recording medium comprises a program including instructions which when executed by a processing device using the program causes the processing device to: control an optical amplifier to oscillate light having a first wavelength band in response to a laser modulation signal; receive from reference signal generator at least a portion of light having a second wavelength band amplified to generate a reference signal; and control a filter filtering the light having the first wavelength band to provide the light having the second wavelength band narrower than the first wavelength band to stabilize a wavelength center of the output of the laser using feedback of a time difference between the laser modulation signal and the reference signal.

Other features and aspects are apparent from the following detailed description, the drawings, and the claims.

BRIEF DESCRIPTION OF THE DRAWINGS

FIG. 4 is a flowchart illustrating an example of a method of stabilizing a laser.

Throughout the drawings and the detailed description, unless otherwise described, the same drawing reference numerals refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein are suggested to those of ordinary skill in the art. The to progression of processing steps and/or operations described is provided as an example unless otherwise stated, and the sequence of processing steps and/or operations is not limited to that set forth herein and may be changed as is known in the art, unless otherwise stated. Also, description of well-known functions and constructions may be omitted for increased clarity and conciseness.

Figure 1:
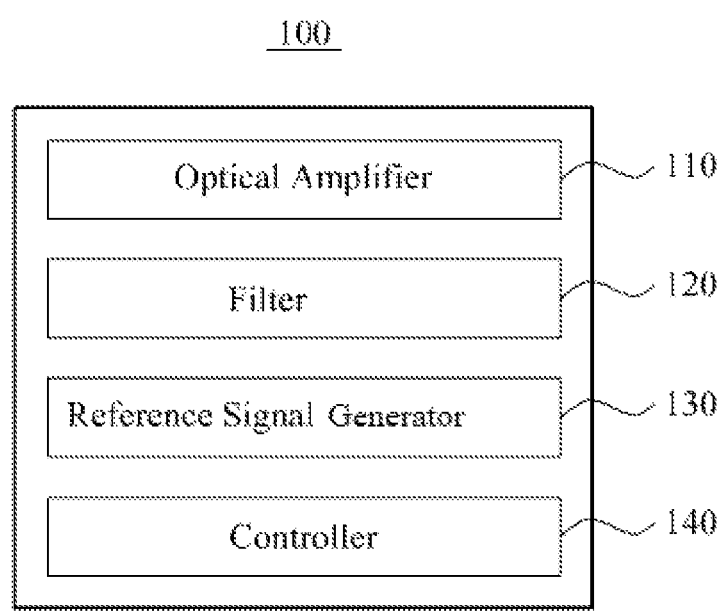
FIG. 1 is a diagram illustrating an example of an apparatus for stabilizing a laser.

FIG. 1 illustrates an example of an apparatus 100 configured to stabilize a laser. The apparatus 100 stabilizes a wavelength center during operation of the laser in various devices, such as, for example, a laser that is used as a light source in a medical device. In one example, such a medical device may be a second generation OCT system. The apparatus 100 may include an optical amplifier 110, a filter 120, a reference signal generator 130, and a controller 140.

The optical amplifier 110 oscillates a light source. The filter 120 filters the light from the optical amplifier 110. The filter 120 filters light having a first wavelength band (e.g., a broad band) to provide light having a second wavelength band (e.g., a narrow band). The second wavelength band corresponds to an optimal or desired range for operation of the laser. In one example, the optical amplifier 110 may be implemented using a semiconductor optical amplifier (SOA)/isolator, and the filter 120 may be implemented using a tunable Fabry-Perot filter.

In a conventional laser having high speed wavelength tuning using a tunable Fabry-Perot filter, an operating value of the tunable Fabry-Perot filter is manually controlled by an operator to adjust the wavelength center. However, according to examples provided herein, the process of adjusting the wavelength center may be automatically performed at high speed in the tunable Fabry-Perot filter. According to this process, the controller 140 receives feedback based on a reference signal from the reference signal generator 130 and controls the operating parameter of the tunable Fabry-Perot filter by amplifying at least a portion of the light in the second wavelength band. In one example, the reference signal generator 130 may be implemented using a fiber Bragg grating (FBG), and the controller 140 may be implemented using a data acquisition (DAQ) board included in the laser device.

As mentioned above, the tunable Fabry-Perot filter may be affected by external factors, for example, temperature in a peripheral environment. As a result, the wavelength center may continuously change over time with changes in these external factors. Accordingly, conventional technology requires the operating value to be manually adjusted every time the wavelength tunable laser is operated. However, according to the examples provided herein, the wavelength center of the wavelength tunable laser may be stabilized automatically by performing feedback and control, thereby improving convenience of use and speed of operating the wavelength tunable laser.

Hereinafter, operation of an apparatus configured to stabilize a laser is further described in detail with reference to an example provided in FIG. 2.

Figure 2:
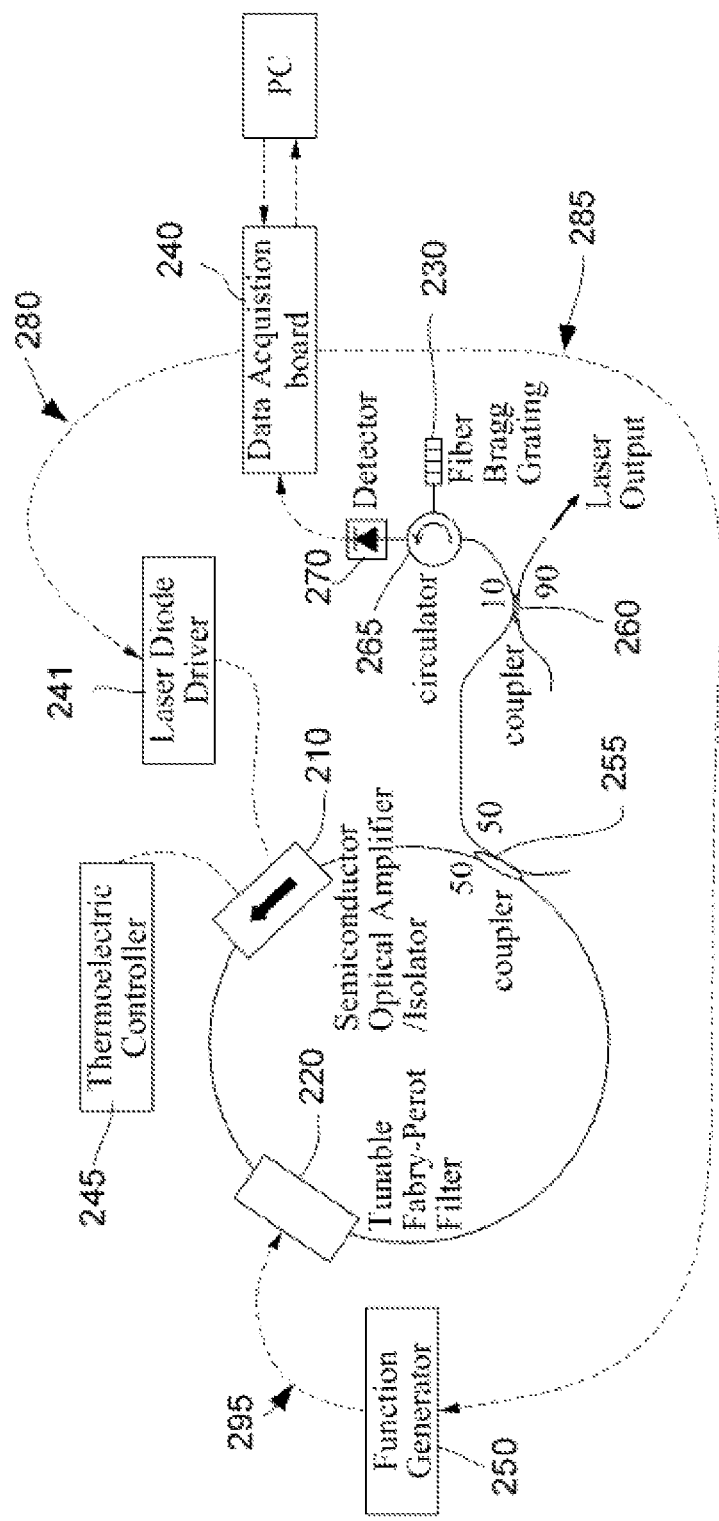
FIG. 2 is a diagram illustrating an example of implementation of an apparatus for stabilizing a laser and an operating method thereof.

FIG. 2 illustrates an example of implementation of the laser stabilizing apparatus 100 of FIG. 1 and an operating method thereof. As described with reference to FIG. 1, in this example, the optical amplifier 110 of the apparatus 100 may be implemented using a SOA/isolator 210; the filter 120 may be implemented using a tunable Fabry-Perot filter 220; the reference signal generator 130 may be implemented using an FBG 230; and the controller 140 may be implemented using a DAQ board 240. In addition, a laser diode driver 241, a thermoelectric controller 245, a function generator 250, a first coupler 255, a second coupler 260, a circulator 265, and detector 270 are shown.

A wavelength center of a laser may be stabilized by adjusting the center of a wavelength tuned by the tunable Fabry-Perot filter according to a desired wavelength of operation of the laser. According to the example of FIG. 2, a laser modulation signal used to control the SOA/isolator is compared to a reference signal generated by the FBG. Information about the difference in time between the laser modulation signal and the reference signal is used to change the offset of an operating signal of the tunable Fabry-Perot filter.

Figure 3:
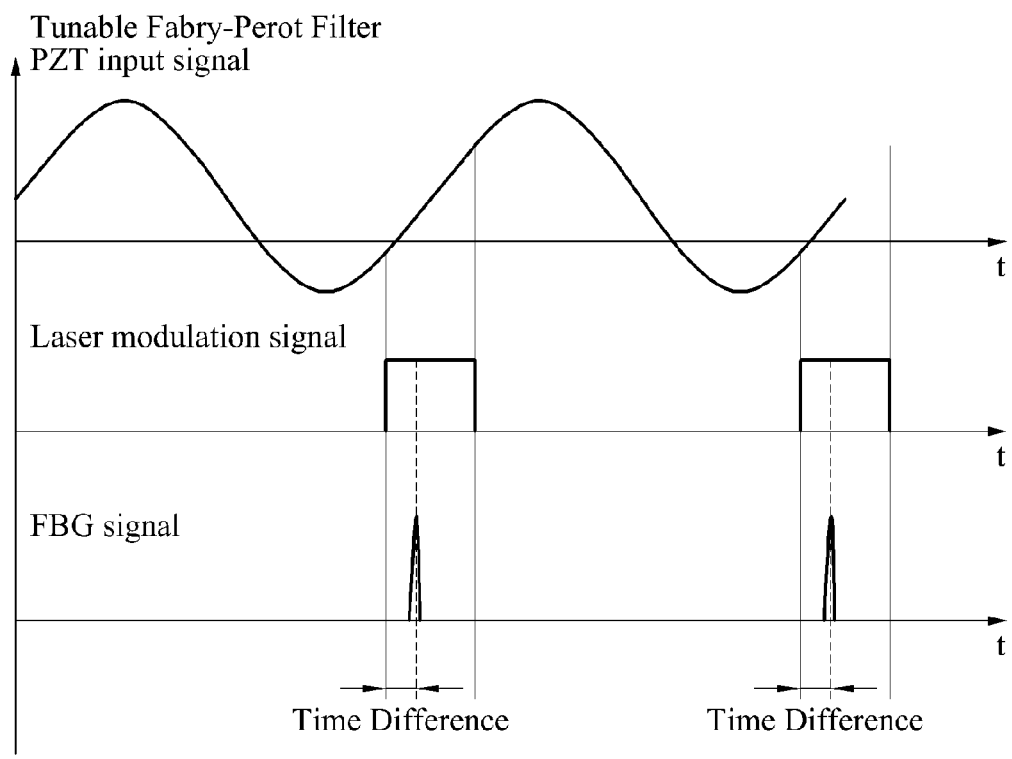
FIG. 3 is a diagram illustrating an example of a feedback process in a method of stabilizing a laser.

The SOA/isolator and the tunable Fabry-Perot filter work to stabilize the laser. When the DAQ board of the controller is powered ON, a thermoelectric controller (TEC) and a laser diode (LD) driver operate the SOA/isolator. In this example, a laser modulation signal of the LD driver is output from the DAQ board 280. The laser modulation signal may be provided in a form of a square wave. The laser modulation signal enables operation of the laser at a desired point in time only. An example of a laser modulation signal is shown in FIG. 3. In addition, the tunable Fabry-Perot filter may be operated by a function generator that is controlled by the DAQ board 285.

Light oscillated by the SOA/isolator has a first wavelength band (e.g., a broad wavelength band). The light from the SOA/isolator passes through the tunable Fabry-Perot filter. The tunable Fabry-Perot filter filters the light. The filtered light is output as a second wavelength band (e.g., narrow wavelength band). The foregoing process may be referred to as the filtering process.

An internal portion of the tunable the Fabry-Perot filter may include a Fabry-Perot mirror. The Fabry-Perot mirror may include lead zirconate titanate (PZT) (i.e., $Pb[Zr_xTi_{1-x}]O_3 0 \leq x \leq 1$). Since the qualities of PZT are well understood by those skilled in the art additional description is omitted. During the filtering process, the tunable Fabry-Perot filter may momentarily transmit only light having a narrow line width corresponding to a transparent condition of the Fabry-Perot mirror. The process of tuning the wavelength of the laser is performed by changing the transparent condition thereby changing a wavelength of light corresponding to the transparent condition.

According to the example provided in FIG. 2, the wavelength-tuned laser output through the aforementioned processes is output through a first coupler having a 50:50 transmission ratio. 50% of the output laser then passes through a second coupler having a 10:90 transmission ratio. As a result, 90% of the laser output from the second coupler may be used as a laser for generating a medical image, and 10% of the laser output reaches the FBG, through a circulator. The detailed values of the transmission ratios of the couplers have been provided as examples only and thus, modifications to these values can be made within the scope of this disclosure.

The FBG may refer to an optical component that reflects light of a predetermined wavelength corresponding to a physical characteristic of the fiber to generate a reference signal. The reference signal output by the FBG is passed from a detector as an electrical signal input to the DAQ 290.

The DAQ board receives the reference signal as part of a feedback process. In particular, the DAQ board compares the input reference signal to the laser modulation signal, and measures the time difference between the input reference signal and the laser modulation signal. The time difference is illustrated in detail in the form of a timing diagram shown in FIG. 3.

When tuning is performed based on a desired wavelength, feedback for controlling the offset of the PZT may be performed by comparing 1) the time difference between the current laser modulation signal and the reference signal input from the FBG and 2) the time difference corresponding to an interval between the laser modulation signal and the input reference signal for a range of normal operation (which also may be referred to as a difference in an oscillation time in a predetermined range of a normal operation, since the difference in the oscillation time is determined experimentally).

This comparison allows a differential of the time difference between the current laser modulation signal and the reference signal provided by the FBG and the difference in the oscillation time in the predetermined range of the normal operation of the laser to be controlled to be less than or equal to a predetermined criterion. The controlling process is further described with reference to FIG. 3.

When the differential is greater than the predetermined criterion, the DAQ board may change the offset value of the PZT controlling the Fabry-Perot mirror in the internal portion of the tunable Fabry-Perot filter 295. For example, a voltage, an offset value, and a phase of a signal have an effect on the operation of the PZT. As a result, changing the offset value changes the wavelength band of the tunable Fabry-Perot filter.

Through recursive control of the offset value, the wavelength center of a laser having a tunable wavelength may be stabilized automatically. In this process, the stabilization may be performed rapidly and accurately without the need for separate manual control by a user. Thus, the process may be construed as an automatic feedback process.

FIG. 3 illustrates an example of the feedback process in a method of stabilizing a laser. As shown in FIG. 3, the horizontal axis denotes an axis of a time (t).

The top portion of the graph indicates the PZT input signal of a tunable Fabry-Perot filter, and the unit of the vertical axis corresponds to a voltage. The intermediate portion of the graph indicates a square wave illustrating the laser modulation signal. The bottom portion of the graph indicates the reference signal, for example, an FBG signal. In the intermediate and the bottom portions of the graph, the vertical axis denotes intensity.

As described with reference to FIG. 2, the DAQ board compares a predetermined criterion to a differential between 1) the time difference between the laser modulation signal and the reference signal provided by the FBG, and 2) a time difference in a predetermined range of normal operation. The DAQ board controls the offset value of the PZT input signal such that the differential is less than or equal to the predetermined criterion. The foregoing process is further described with reference to FIG. 4.

FIG. 4 illustrates an example of a method of stabilizing a laser.

A DAQ board powers ON a TEC, an LD driver, and a function generator when an operation of the apparatus 100 of FIG. 1 for stabilizing a laser is initiated 410. When the TEC, the LD driver, and the function generator are turned ON, an SOA/isolator is oscillated to produce light having a first wavelength band (e.g., a broad band) which is input to a tunable Fabry-Perot filter. The tunable Fabry-Perot filter transmits light having a second wavelength band (e.g., a narrow band) by momentarily transmitting light having a narrow line width only according to a transparent condition of a Fabry-Perot minor.

In the process of tuning a wavelength, the Fabry-Perot minor is controlled to oscillate by PZT and change a transparent condition of light at every moment. The wavelength of light corresponding to the transparent condition is changed, as described with reference to FIG. 2.

The light from tunable Fabry-Perot filter may be output through the first coupler of FIG. 2 having a 50:50 transmission ratio. A portion of the light from the first coupler is output to the SOA/isolator while the remaining portion of light is passed through the second coupler of FIG. 2 having a 10:90 transmission ratio. 90% of the light from the second coupler is output as a laser, for example, to generate a medical image. The other 10% of the light from the second coupler may be input to the FBG via the circulator.

The light received by the FBG is used to generate a reference signal. The FBG generates the reference signal by reflecting light having a predetermined wavelength corresponding to a physical characteristic of the FBG. The generated reference signal is provided to the DAQ board. In this instance, the reference signal output by the FBG may be input to the DAQ board in a form of an electrical signal from the detector.

The DAQ board determines a time difference between the laser modulation signal and the reference signal (i.e., the FBG signal) 420 as illustrated in FIG. 3.

The DAQ board compares the time difference between the laser modulation signal and the reference signal to the time difference in a predetermined normal operation state (e.g., an optimum state). The DAQ board also compares a predetermined criterion to the differential of 1) the time difference between the laser modulation signal and the reference signal and 2) the time difference in the optimum state. When the differential is less than or equal to the predetermined criterion, the DAQ board determines that a current wavelength center is stabilized, controlling an offset value is unnecessary, and a separate control process is not performed. The operation 420 may be performed continuously.

Conversely, when the differential is greater than the predetermined criterion, the offset value may be controlled through subsequent operations, whereby stabilization of the wavelength center is performed through the feedback process.

Whether a time difference is positive is used to determine whether the offset value is to be increased or decreased is determined 430. For example, when the current time difference is greater than the time difference of the optimum state, the DAQ board decreases the offset value 450. Conversely, when the current time difference is less than the time difference of the optimum state, the DAQ board increases the offset value 440.

Since the offset value may be recursively controlled during the feedback process, the center of wavelength of the tunable laser may be stabilized automatically.

Accordingly, as described above, the task of manually adjusting a wavelength center every time a laser is operated is made unnecessary, and users unfamiliar with technical knowledge about a tunable Fabry-Perot filter may control the tunable Fabry-Perot filter more readily. As a result, marketability and manipulation of equipment may be greatly improved for second generation OCT, such as a medical device or an imaging system.

Some components described herein may be implemented using hardware components, software components, or a combination thereof. For example, the DAQ may include a processing device. The processing device may be implemented using one or more general-purpose or special purpose computers, such as, for example, a processor, a controller, an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS, such as a feedback process and/or a control process. The processing device also may access, store, to manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such as parallel processors.

The software may include a computer program, a piece of code, an instruction, or some combination thereof, for independently or collectively instructing or configuring the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. In particular, the software and the data may be stored by one or more computer readable recording mediums.

The computer readable recording medium may include any data storage device that can store data which can be thereafter read by a computer system or processing device. Examples of the computer readable recording medium include read-only memory (ROM), random-access memory (RAM), CD-ROMs, magnetic tapes, floppy disks, optical data storage devices. Also, functional programs, codes, and code segments for accomplishing the example embodiments disclosed herein can be easily construed by programmers skilled in the art to which the embodiments pertain based on and using the flow diagrams and block diagrams of the figures and their corresponding descriptions as provided herein.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An apparatus configured to stabilize an output of a laser, the apparatus comprising:
   an optical amplifier configured to oscillate light having a first wavelength band based on a laser modulation signal;
   a filter configured to filter the light having the first wavelength band and output light having a second wavelength band narrower than the first wavelength band;
   a reference signal generator configured to generate a reference signal by amplifying at least a portion of the light having the second wavelength band; and
   a controller configured to minimize a time difference between the laser modulation signal and the reference signal using feedback of the time difference between the laser modulation signal and the reference signal.

2. The apparatus of claim 1, wherein the filter includes a Fabry-Perot mirror having a transparent condition configured to provide light having a narrow band wavelength corresponding to the second wavelength band.

3. The apparatus of claim 2, wherein the filter is a tunable Fabry-Perot filter.

4. The apparatus of claim 3, wherein the tunable Fabry-Perot filter is configured to change the transparent condition by oscillating the Fabry-Perot mirror using lead zirconate titanate (PZT).

5. The apparatus of claim 4, wherein the controller is configured to:
- compare a predetermined criterion to a differential of:
  - a time difference between the laser modulation signal and the reference signal, and
  - a difference in an oscillation time in a predetermined range of a normal operation of the laser; and
- change an offset of the PZT when the comparison indicates the differential is less than or equal to the predetermined criterion.

6. The apparatus of claim 1, wherein the reference signal generator is a fiber Bragg grating (FBG) configured to amplify at least a portion of the light having the second wavelength band corresponding to a characteristic value of the FBG to generate the reference signal.

* * * * *